United States Patent [19]
Olmstead

[11] 3,745,426
[45] July 10, 1973

[54] INSULATED GATE FIELD-EFFECT TRANSISTOR WITH VARIABLE GAIN

[75] Inventor: John Aaron Olmstead, Somerville, N.J.

[73] Assignee: RCA Corporation, New York, N.Y.

[22] Filed: June 1, 1970

[21] Appl. No.: 41,867

[52] U.S. Cl. .......... 317/235 R, 317/235 B
[51] Int. Cl. .......... H01l 11/00
[58] Field of Search .......... 317/235

[56] References Cited

UNITED STATES PATENTS

| | | | |
|---|---|---|---|
| 3,566,213 | 2/1971 | Kaiser | 317/234 |
| 3,562,608 | 2/1971 | Gallagher et al. | 317/235 |
| 3,374,407 | 3/1968 | Olmstead | 317/235 |
| 3,328,601 | 6/1967 | Rosenbaum | 307/88.5 |

FOREIGN PATENTS OR APPLICATIONS

| | | | |
|---|---|---|---|
| 447,390 | 11/1967 | Switzerland | 317/235 |

*Primary Examiner*—John W. Huckert
*Assistant Examiner*—E. Wojciechowicz
*Attorney*—Glenn H. Bruestle, H. Christoffersen and R. P. Williams

[57] ABSTRACT

An insulated gate field-effect transistor comprising a source and drain which define the ends of a plurality of current carrying paths of controllable conductivity, and a gate separated from the current paths by an insulator. The width of the gate is less than the length of some of the current paths below it and is spaced from the drain in a direction parallel to the current paths with a spacing that varies along the length of the drain; and, therefore, different drain voltages are required to achieve conduction along different ones of the current-carrying paths for any given gate voltage. This permits varying the drain voltage to achieve a variable gain.

10 Claims, 7 Drawing Figures

INVENTOR.
John A. Olmstead
BY
D. J. Hoffman
ATTORNEY

INVENTOR
John A. Olmstead
BY
D. J. Hoffman
ATTORNEY

INSULATED GATE FIELD-EFFECT TRANSISTOR WITH VARIABLE GAIN

BACKGROUND OF THE INVENTION

This invention relates to insulated gate field-effect transistors having a variable gain; and, more particularly, to transistors in which the gain is a function of the drain voltage.

A typical insulated gate field-effect transistor consists of source and drain regions of one type high conductivity disposed in a substrate of a second type conductivity so as to form a channel region between the source and drain, with a gate electrode disposed above and separated from the channel by a layer of insulating material. Since the channel is of a different type conductivity, there is, initially, little or no current flow between the source and drain, and the conduction through the channel is controlled by the bias applied to the gate electrode above the channel. In an enhancement type device, the channel is not conductive at zero bias; and it does not become conductive until a sufficient bias is supplied to form an inversion layer of the first type conductivity under the insulator. The source and drain regions are then connected by the thin inversion layer of the same type conductivity. A signal on the gate determines the existence and the magnitude of inversion layer so that the gate, in effect, controls the current flowing through the channel.

The gain of an insulated gate field-effect transistor is primarily related to its transconductance, which is defined as the ratio of the differential change of the drain current through the channel to the differential change of the gate voltage at constant drain voltage; and its gain characteristic is represented by a plot of the transconductance as a function of the gate voltage. Most transistors have a simple "straight line" gain characteristic where the transconductance is a linear function of the gate voltage. The variable gain transistor, however, is purposely designed to achieve a more desirable gain characteristic than that of the normal transistor. In general, the transistors were structurally designed so that the transconductance was regulated by varying the bias voltage on the transistor.

In previous variable gain transistors, the bias voltage on the gate electrode was regulated; and, thus, the variable gain was a function of the gate voltage. The gate was selected to provide the variable gain because it has a high impedance input which does not draw any DC current; and, consequently, did not require the consumption of any power to adjust the gate voltage. However, at the present state of the technology, these transistors have been difficult to fabricate and have had poor reproducibility.

Structurally, the variable gain was achieved by modifying the insulator, gate, or channel regions of the transistors so that a given increase in the gate voltage produced a different increase in the drain current and the transconductance at different gate voltages. For example, in one type of transistor, the variable gain was obtained by varying the thickness of the insulating layer under the gate electrode along the length of the gate so that greater percentages of the gate were activated with increasing gate voltages. Typically, the insulating layer was fabricated by the consecutive deposition and etching of a large number of overlapping oxide layers to provide a multi-stepped insulator along the length of the channel region. Although this method of fabrication produced a suitable insulating layer, it required a large number of additional deposition and photoetching steps. The additional steps were time consuming and so expensive that it was not economically feasible to manufacture the transistors.

In a similar type of transistor, the variable gain was achieved by using a number of different insulating materials for the different parts of the insulator along the length of the gate. These transistors were difficult to fabricate for reasons similar to those discussed above. in particular, there is a limited number of insulators which can be utilized because of their dielectric constants, dielectric strengths, thermal expansions, and lack of adequate technology for their deposition nd subsequent photo etching. Thus, it was difficult to fabricate these transistors; and they could not be made economically.

In another type of transistor, the variable gain was achieved by modifying the conductivity of the channel region along its length. However, the conductivity modification was very difficult to perform accurately due to the inherent characteristics of the transistor. In particular, the channel region is less than 100 A. thick and has a very low conductivity. Consequently, the control of such a thin, high-resistivity region is impractical with today's technology; and the resulting transistors have been unstable and have had poor reproducibility.

In another type of transistors, the shape of the gate electrode is modified to produce a widening current path between the source and drain regions. However, due to inherent limitations in the present semiconductor technology, very little variation in the gain is achieved; and it has little practical utility.

At the present, there is a need for a variable gain transistor which can be fabricated simply and economically in view of the present technology, and still provide a large gain variation with good device reproducibility.

DESCRIPTION OF THE PREFERRED EMBODIMENTS

Figure 1:
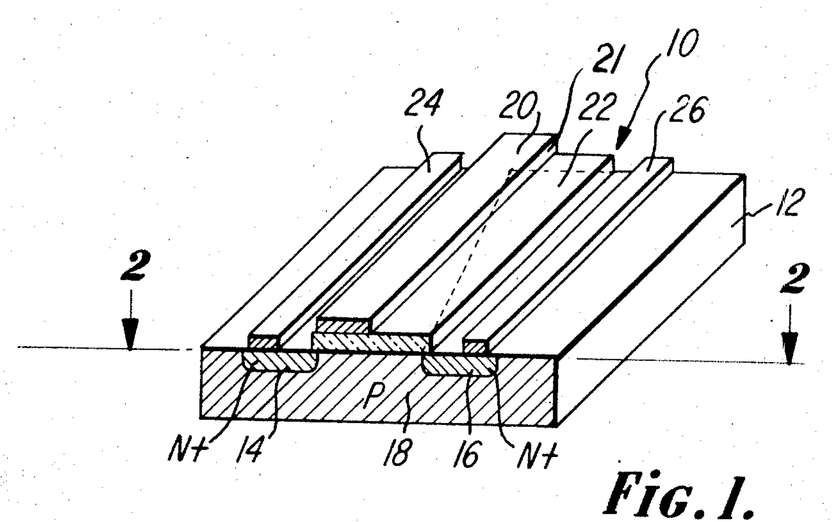
FIG. 1 is a perspective view of a variable gain transistor of the present invention.
Figure 2:
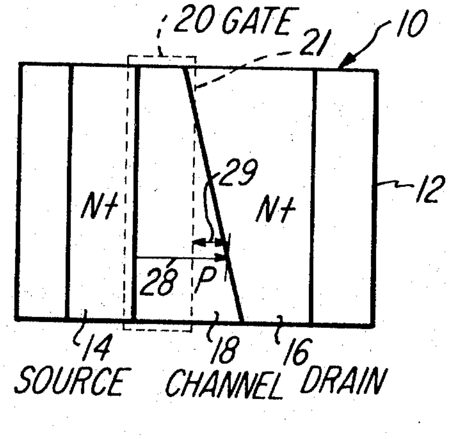
FIG. 2 is a diagrammatic section along line 2—2 of FIG. 1.

FIGS. 1 and 2 illustrate a first embodiment of an insulated gate field-effect transistor 10 incorporating the present invention. The transistor 10 is schematically shown as part of an integrated circuit; however, it can also be fabricated as a discrete device if desired. The transistor 10 comprises a body of semiconductor material 12 of one type conductivity and has source and drain regions 14 and 16 of a second type conductivity. In the present transistor 10, the semiconductor body 12 is of "P" type conductivity, and the source and drain regions 14 and 16 are of N+ type conductivity. The source and drain regions 14 and 16 define the ends of a plurality of current-carrying paths of controllable conductivity which are generally referred to as the channel region 18. A gate electrode 20 is positioned above and spaced from the channel region 18 by an insulator 22. Ohmic contacts 24 and 26 are made along the length of the source and drain regions 14 and 16, and they are usually made of the same material as the gate electrode 20.

The variable gain is obtained by providing a variable spacing between the gate electrode 20 and the drain region 16 in a direction parallel to the current paths in the channel region 18 along the length of the drain 16 so that the spacing is different adjacent to different ones of the current paths. The variable spacing is best illustrated in FIG. 2, which is a top view of the transistor 10 of FIG. 1. The direction of the current in the channel region 18 is schematically represented by a typical current path 28, and it extends from the edge of the source region 14 to the adjacent edge of the drain region 16. The shape of the drain region 16 and the gate electrode 20 are designed so that the gate electrode 20 is not as wide as the lengths of at least some of the current paths 28 disposed below it. And, the gate electrode 20, that is, that edge of the two edges of the gate 20 which extend generally parallel to the long directions of the source 14 and drain 16 which is nearer to the drain, is spaced from the edge of the drain 16 by a distance 29 which varies along the length of the drain 16. In the present transistor 10, the inner edge of the drain region 16, that is, its edge adjacent to the end of the current paths extends at an angle other than 0° or 180° to the inner edge of the source region 14 to produce a channel region 18 with a variable width. As shown in FIG. 1, the insulating layer 22 is disposed over the entire chanel region 18; but the gate electrode 20 is of constant width so that, along part of the length of the channel region 18, the gate electrode 20 is disposed over only a part of the width of the channel region with its "drain" edge 21 parallel to the source region 14. Thus, the gate electrode 20 is not disposed over at least a part of the channel region 18 adjacent the drain region 16, and it is spaced from the drain region 16 by a constant 29 which varies along the length of the drain.

As a result of the variable spacing between the gate electrode 20 and the drain region 16, a different drain voltage is required to achieve conduction along the different current paths 28 for any given gate voltage. Since the gate electrode 20 is not as wide as at least some of the current paths 28, it is not effective, but itself, in making those current paths 28 conductive because it has little effect on the spaced portions 29 of the current paths 28. The conduction in these paths is determined by the magnitude of the drain voltage and the resulting depletion region it creates in the channel 18. As the drain voltage increases, the width of the depletion region increases and connects with more of the current paths under the gate electrode 20. Thus, a greater percentage of the channel region 18 becomes conductive a the drain voltage increases; and consequently, as shown in FIG. 4, the drain current increases with increasing drain voltages, for any given gate voltage; whereas, the drain current of a normal transistor rapidly saturates and flattens out with increasing drain voltage.

Figure 4:
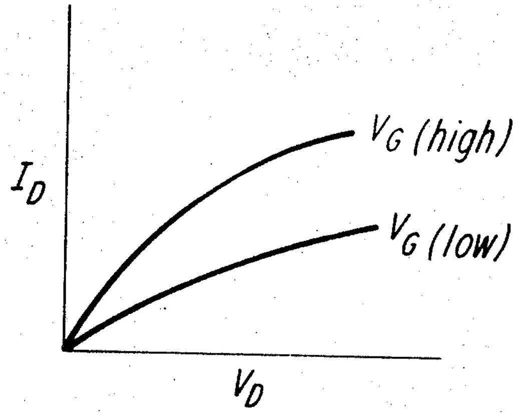
FIGS. 4, 5, and 6 are graphs which illustrate the electrical characteristics of the transistor shown in FIGS. 1 and 2.
Figure 5:
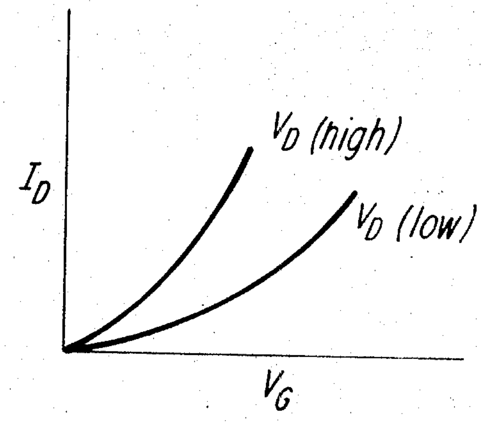
Figure 6:
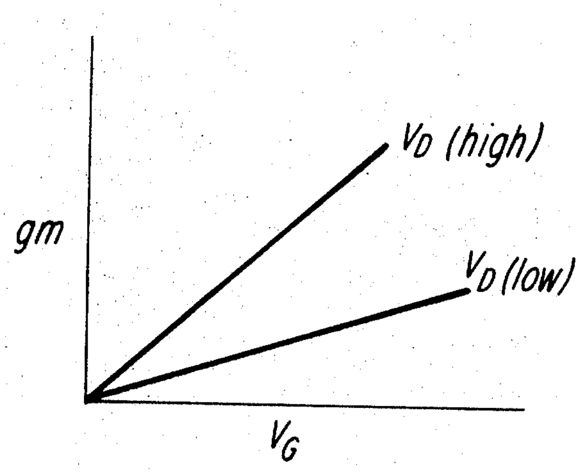

However, the drain current is also a function of the gate voltage, as illustrated in FIGS. 4 and 5. As shown in FIG. 5, which is a plot of the drain current as a function of the gate voltage for two different drain voltages, the drain current increases with increasing gate voltage; and it increases faster at high drain voltages than at low drain voltages. Consequently, the transconductance and the gain of the transistor 10 are also functions of the drain voltage and the gate voltage. This is illustrated in FIG. 6 where the transconductance is plotted as a function of the gate voltage for two different drain voltages. As shown in FIG. 6, for any given drain voltage, the transconductance increases with increasing gate voltage; and an entire family of gain characteristics are achieved by varying the drain voltage.

The rate of increase in the drain current and gain of the transistor are dependent upon the spacing between the gate electrode 20 and the drain region 16. In the present transistor 10, as best shown in FIG. 2, the spacing 29 between the gate 20 and the drain 16 varies linearly along the length of the drain. Thus, the drain current increases linearly with the extending depletion region. However, the depletion region only increases with the square root of the drain voltage; so that, as shown in FIG. 4, the drain current increases slower at higher drain voltages.

Figure 3:
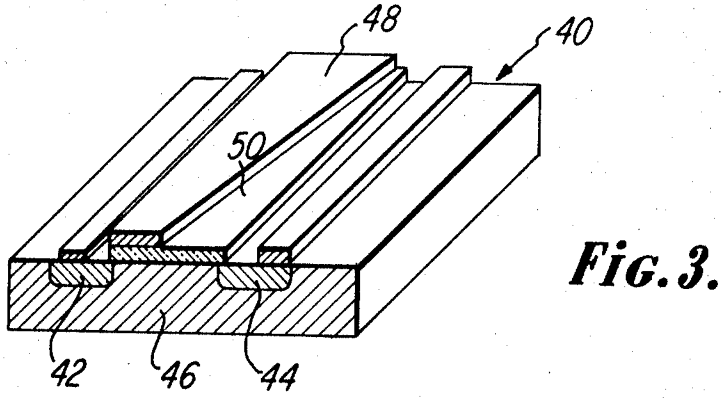
FIG. 3 is a perspective view of another transistor of the present invention.

The linear spacing between the gate and drain regions may also be obtained with the transistor 40 shown in FIG. 3. The transistor 40 is similar to the transistor 10 of FIG. 1, and it includes source 42 and drain 44 regions defining a channel 46 with a gate electrode 48 spaced from the channel 46 by insulator 50. However, the shapes of the gate 48 and the drain 44 are opposite to those of the transistor 10. In this embodiment, the source 42 and drain 44 regions are parallel to one another and define a channel 46 having a uniform width; but the gate 48 is spaced diagonally to the edge of the drain 44 and is not as wide as at least some of the current paths beneath it. Thus, the gate 48 is still spaced from the drain 44 in a direction parallel to the current paths with a spacing that varies linearly along the length of the drain 44.

Figure 7:
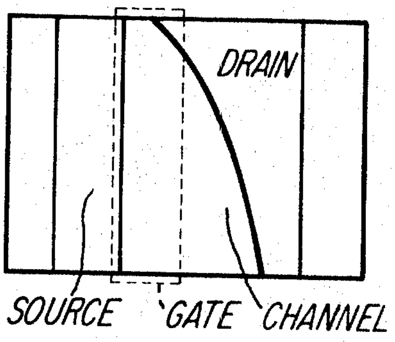
FIG. 7 is a top view of another transistor of the present invention.

Other source-to-drain spacing may also be fabricated when different electrical characteristics are desired. For example, when a greater incremental increase in the drain current is desired at higher voltages, the transistor may be fabricated as shown in FIG. 7. Here, the variable spacing between the gate and drain regions is curved. More particularly, the incremental increase in the spacing decreases as the spacing increases. Thus, the drain current now increases more linearly with the drain voltage. Similarly, other gate to drain spacings could also be fabricated just as easily.

Additionally, the gate electrode may or may not overlap the drain region as long as a portion of the gate electrode has a variable spacing from the drain region.

The present transistors can be fabricated easily and economically. They are fully compatible with standard fabrication procedures, and they do not require any complex or additional fabrication steps. It is only necessary to slightly modify the geometry of the photolithographic masks used to define the gate and drain regions so that a variable spacing is obtained between the gate and drain regions. Consequently, these transistors can be fabricated easily and reproducibly along with the other electrical components in an integrated circuit without any additional fabrication steps.

What is claimed is:

1. An insulated gate-field effect transistor comprising a source and drain defining the ends of a plurality of current-carrying paths of controllable conductivity, and a gate separated from said current paths by an insulator, said gate having at least a portion of that one of its edges which is nearer to said drain spaced from said drain in a direction parallel to the current paths with the spacing varying along the length of said drain.

2. An insulated gate field-effect transistor as in claim 1 wherein said variable spacing varies linearly along the length of said drain.

3. An insulated gate field-effect transistor as in claim 1 wherein said variable spacing is curved.

4. An insulated gate field-effect transistor comprising a source and drain defining the ends of a plurality of current paths of controllable conductivity, and a gate separated from said current paths by an insulator, the width of at least a portion of said gate being less than that of the current paths disposed below it, and that one of the edges of said gate which is nearer to said drain being spaced from said drain with a spacing that varies along the length of said drain.

5. An insulated gate field-effect transistor as in claim 4 wherein said source and drain regions are spaced at some angle from one another and said gate electrode is adjacent and parallel to said source region.

6. An insulated gate field-effect transistor as in claim 4 wherein said source and drain regions are parallel and said gate electrode is spaced at some angle from said drain region.

7. An insulated gate field-effect transistor comprising a source and a drain defining the ends of a plurality of current-carrying paths of controllable conductivity, and a gate separated from said current paths by an insulator, said source and drain each having edges adjacent to the ends of said current-carrying paths, said gate having two oppositely disposed edges, one edge being nearer to said drain than is the other, at least a part of said one edge of said gate and said edge of said drain being spaced from each other in a direction parallel to said current-carrying paths, with the spacing being different adjacent to different ones of said current-carrying paths.

8. An insulated gate field-effect transistor as in claim 7 wherein said edge of said drain extends at an angle to said edge of said source, and said edges of said gate are parallel to said edge of said source.

9. An insulated gate field-effect transistor as in claim 7 wherein said edges of said source and said drain are parallel and said one edge of said gate extends at an angle to said edge of said drain.

10. An insulated gate field-effect transistor as in claim 7 wherein said edge of said drain is curved.

* * * * *